US010620233B2

(12) United States Patent
Cook

(10) Patent No.: US 10,620,233 B2
(45) Date of Patent: Apr. 14, 2020

(54) PIEZOELECTRIC TRANSDUCER

(71) Applicant: KISTLER HOLDING AG, Winterthur (CH)

(72) Inventor: Andrew Paul Cook, Williamsville, NY (US)

(73) Assignee: KISTLER HOLDING AG, Winterthur (CH)

( * ) Notice: Subject to any disclaimer, the term of this patent is extended or adjusted under 35 U.S.C. 154(b) by 513 days.

(21) Appl. No.: 15/588,962

(22) Filed: May 8, 2017

(65) Prior Publication Data

US 2017/0370962 A1 Dec. 28, 2017

Related U.S. Application Data

(60) Provisional application No. 62/355,538, filed on Jun. 28, 2016.

(51) Int. Cl.
*H01L 41/09* (2006.01)
*G01P 15/09* (2006.01)
(Continued)

(52) U.S. Cl.
CPC ............ *G01P 15/09* (2013.01); *G01L 1/16* (2013.01); *G01L 1/26* (2013.01); *G01L 9/0022* (2013.01);
(Continued)

(58) Field of Classification Search
CPC ...... G01P 15/09; G01P 15/0915; G01P 21/00; G01L 1/16; G01L 1/26; G01L 9/0022; H01L 41/09; H03H 9/581; H04R 17/10
(Continued)

(56) References Cited

U.S. PATENT DOCUMENTS 3,349,259 A * 10/1967 Kistler .................... G01L 9/08
29/595
3,673,442 A    6/1972 Sonderegger
(Continued)

FOREIGN PATENT DOCUMENTS

DE        2605809        8/1977
WO    WO 2006037145    4/2006

OTHER PUBLICATIONS

Crescini D., et al: "Large bandwidth and thermal compensated piezoelectric thick-film acceleration transducer", Sensors and Actuators A: Physical, Elsevier BV, NL, vol. 87, No. 3, Jan. 5, 2001, pp. 131-138.
European Search Report (16190202.8), dated Feb. 17, 2017.
Extended European Search Report (17170415.8), dated Dec. 7, 2017.

*Primary Examiner* — Thomas M Dougherty
(74) *Attorney, Agent, or Firm* — Dority & Manning, P.A.

(57) ABSTRACT

A piezoelectric transducer for measuring a force includes a base element; a pre-loading element; at least one effective main seismic mass aggregation of pre-loaded parts capable of producing the force when being accelerated; a main piezoelectric ceramic element including a first piezoelectric ceramic; at least one compensation seismic mass aggregation of pre-loaded parts capable of producing a compensation force when being accelerated; a compensation piezoelectric ceramic element including a second piezoelectric ceramic. The first piezoelectric ceramic has a thermal sensitivity shift smaller than the second piezoelectric ceramic. The main piezoelectric ceramic element is oriented with respect to the force to be measured and the compensation piezoelectric ceramic element is oriented with respect to the compensation force such that the main electric charge and the compensation electric charge are opposite in polarity.

17 Claims, 10 Drawing Sheets

(51) Int. Cl.
  *G01L 1/16* (2006.01)
  *G01L 9/00* (2006.01)
  *H03H 9/58* (2006.01)
  *H04R 17/10* (2006.01)
  *G01P 21/00* (2006.01)
  *G01L 1/26* (2006.01)

(52) U.S. Cl.
  CPC .......... *G01P 15/0915* (2013.01); *G01P 21/00* (2013.01); *H01L 41/09* (2013.01); *H01L 41/0926* (2013.01); *H03H 9/581* (2013.01); *H04R 17/10* (2013.01)

(58) Field of Classification Search
  USPC ....... 310/311, 323.01–323.19, 328, 329, 346
  See application file for complete search history.

(56) References Cited

U.S. PATENT DOCUMENTS

| | | | |
|---|---|---|---|
| 5,115,161 A * | 5/1992 | Myohga | H02N 2/106 |
| | | | 310/323.15 |
| 5,557,968 A | 9/1996 | Krempl et al. | |
| 7,618,188 B2 | 11/2009 | Glaser et al. | |
| 8,836,202 B2 * | 9/2014 | Ting | H02N 2/186 |
| | | | 310/328 |
| 2007/0283769 A1 | 12/2007 | Glaser et al. | |
| 2009/0236938 A1 * | 9/2009 | Bromfield | B06B 1/0611 |
| | | | 310/323.19 |
| 2016/0103545 A1 | 4/2016 | Filiz et al. | |

* cited by examiner

PIEZOELECTRIC TRANSDUCER

CROSS-REFERENCE TO RELATED APPLICATIONS

The present application claims priority to U.S. Provisional Patent Application Ser. No. 62/355,538 filed Jun. 28, 2016, which is hereby incorporated herein in its entirety by this reference for all purposes.

FIELD OF THE INVENTION

The invention relates to a piezoelectric transducer, and more particularly to an acceleration transducer.

BACKGROUND

An acceleration transducer is a force transducer with an attached so called seismic mass. The inertia of the seismic mass produces a force when being accelerated and this force is measured by the acceleration transducer. The force is the measurand. As the seismic mass is constant, the measured force is proportional to the acceleration. Acceleration is defined as the time rate of change in velocity.

Piezoelectric transducers are comprised of piezoelectric material that creates electric charge when subjected to a force. The electric charge is proportional to the applied force and can be measured directly by means of electrodes. Piezoelectric transducers offer the advantages of a fast response time of a few μsecs and a wide measurand range of the order of 100 Db. Piezoelectric transducers are thus utilized to measure dynamic oscillations and vibrations on machines and structures.

U.S. Pat. No. 3,673,442A discloses a piezoelectric transducer. The piezoelectric transducer uses a quartz crystal as piezoelectric material. It comprises five quartz crystal discs, each of the quartz crystal discs is arranged between two electrodes, forming thus a stack of crystal discs and electrodes. The force to be measured acts along a support axis of the piezoelectric transducer. A clamping sleeve joins the stack and a seismic mass along a longitudinal axis towards a base plate. By doing so, the piezoelectric transducer has a high rigidity along the longitudinal axis and the quartz crystal discs are in close mechanical contact with the electrodes. A close mechanical contact minimizes or eliminates any micro-gaps between the quartz crystal discs and the electrodes and thus assures a clearly defined capacitance of the piezoelectric transducer.

One drawback of quartz crystal is the relatively low piezoelectric sensitivity, especially in comparison with piezoelectric ceramics as piezoelectric material. Piezoelectric sensitivity is defined as the ratio of change in piezoelectric transducer output to a change in the value of the measurand. The change in piezoelectric transducer output is determined by piezoelectric charge coefficients of the piezoelectric material. The greater the piezoelectric charge coefficient, the stronger the piezoelectric transducer output for a given value of the measurand. Piezoelectric ceramics like a mixture of $PbZrO_3$ and $PbTiO_3$, also designated as lead-zirconite-titanate mixed ceramics (PZT) exhibit piezoelectric charge coefficients up to hundred times higher than those of quartz crystal. There is a demand for a piezoelectric transducer with a high piezoelectric sensitivity.

PZT, however, is strongly temperature-dependent and shows an elevated thermal sensitivity shift. The thermal sensitivity shift is defined as the change in piezoelectric sensitivity from within the limits of the operating temperature range of the piezoelectric material referenced to the piezoelectric sensitivity at +20° C. The thermal sensitivity shift is expressed in percent of the piezoelectric sensitivity referenced to the piezoelectric sensitivity at +20° C. The operating temperature range commonly covers −54° C. to +260° C. PZT has a high thermal sensitivity shift of the order of some percent, while quartz crystal has a ten times lower thermal sensitivity shift. The thermal sensitivity shift is a non-linearity in the piezoelectric transducer output, which means that the piezoelectric sensitivity is several percent higher at the higher end of the operating temperature range than at the lower end of the operating temperature range. During a force measurement, the temperature of the piezoelectric transducer is normally unknown, so that the non-linearity over temperature of PZT is a severe drawback of the use of PZT in piezoelectric transducers. This non-linearity over temperature in the piezoelectric transducer output can be determined experimentally by using special calibration equipment. Calibration of a piezoelectric transducer is, however, time consuming and the calibration equipment is expensive. In order to obtain a high linearity in the piezoelectric transducer output over temperature, a low thermal sensitivity shift is desirable.

BRIEF SUMMARY OF THE INVENTION

The aim of the invention is to provide a piezoelectric transducer with high piezoelectric sensitivity and low thermal sensitivity shift.

This aim is achieved by means of a piezoelectric transducer with the features as described below. The piezoelectric transducer for measuring a force comprises a base element; a pre-loading element; at least one effective main seismic mass means capable of producing said force when being accelerated, said effective main seismic mass means being joined by said pre-load element directly or indirectly against said base element; a main piezoelectric ceramic element comprising first piezoelectric ceramic, said first piezoelectric ceramic is capable of generating a main electric charge when subjected to said force, said main piezoelectric ceramic element being joined by said pre-load element directly or indirectly against said effective main seismic mass means; at least one compensation seismic mass means capable of producing a compensation force when being accelerated, said compensation seismic mass means being joined by said pre-load element directly or indirectly against said base element; a compensation piezoelectric ceramic element comprising second piezoelectric ceramic, said second piezoelectric ceramic is capable of generating a compensation electric charge when subjected to said compensation force, said compensation piezoelectric ceramic element being joined by said pre-load element directly or indirectly against said compensation seismic mass means; said first piezoelectric ceramic has a thermal sensitivity shift smaller than said second piezoelectric ceramic; said first piezoelectric ceramic generates main electric charge that is larger in quantity than compensation electric charge generated by said second piezoelectric ceramic; and said main piezoelectric ceramic element being oriented with respect to said force to be measured and said compensation piezoelectric ceramic element being oriented with respect to said compensation force such that said main electric charge and said compensation electric charge are opposite in polarity.

The present invention thus uses piezoelectric ceramic elements with high piezoelectric sensitivity but also with a high thermal sensitivity shift. In order to keep the thermal sensitivity shift low, two piezoelectric ceramic elements are used. Said two piezoelectric ceramic elements are oriented with respect to the force to be measured, such that the electric charge generated in each piezoelectric ceramic element is opposite in polarity. Oppositely poled electric charges are collected. Apparently this approach is not expedient for solving the aim of the invention, because the quantity of collected electric charges is the difference of the quantities of the electric charges of the two piezoelectric ceramic elements. The piezoelectric transducer output which corresponds to the quantity of collected electric charges is thus smaller than possible. In order to obtain a piezoelectric sensitivity as high as possible, one would have collected identically poled electric charges resulting in a summation of the electric charges generated in the two piezoelectric ceramic elements. In order to prevent a zero quantity of collected electric charges, the quantities of the electric charges of the two piezoelectric ceramic elements are different.

The present invention foresees piezoelectric ceramic elements that comprise piezoelectric ceramics of different thermal sensitivity shift. The different sensitivity shifts affect the non-linearity over temperature of the electric charges of the two piezoelectric ceramic elements. The higher the sensitivity shift the greater the non-linearity over temperature of electric charges. According to the invention, the piezoelectric ceramic element that creates the larger quantity of electric charges has a piezoelectric ceramic with a lower thermal sensitivity shift. This piezoelectric ceramic element is called main piezoelectric ceramic element. The other piezoelectric ceramic element that creates the smaller quantity of electric charges has a piezoelectric ceramic with a higher thermal sensitivity shift. This piezoelectric ceramic element is called compensation piezoelectric ceramic element. Collection of electric charges of the main piezoelectric ceramic element and of the compensation piezoelectric ceramic element thus reduces the quantity of the main electric charge to a small extent and reduces the non-linearity over temperature of the main electric charge to a strong extent. Preferably, the quantity of compensation electric charge is substantially smaller than the quantity of main electric charge, resulting thus in a moderate reduction of the quantity of main electric charge. Preferably, the non-linearity over temperature of the compensation electric charge is substantially higher than the non-linearity over temperature of the main electric charge, resulting thus in a substantial reduction of the non-linearity over temperature of the main electric charge.

BRIEF DESCRIPTION OF THE DRAWINGS

The present invention will be described below with the aid of exemplary embodiments in connection with the schematic drawings here.

DESCRIPTION OF EXEMPLARY EMBODIMENTS OF THE INVENTION

Figure 1:
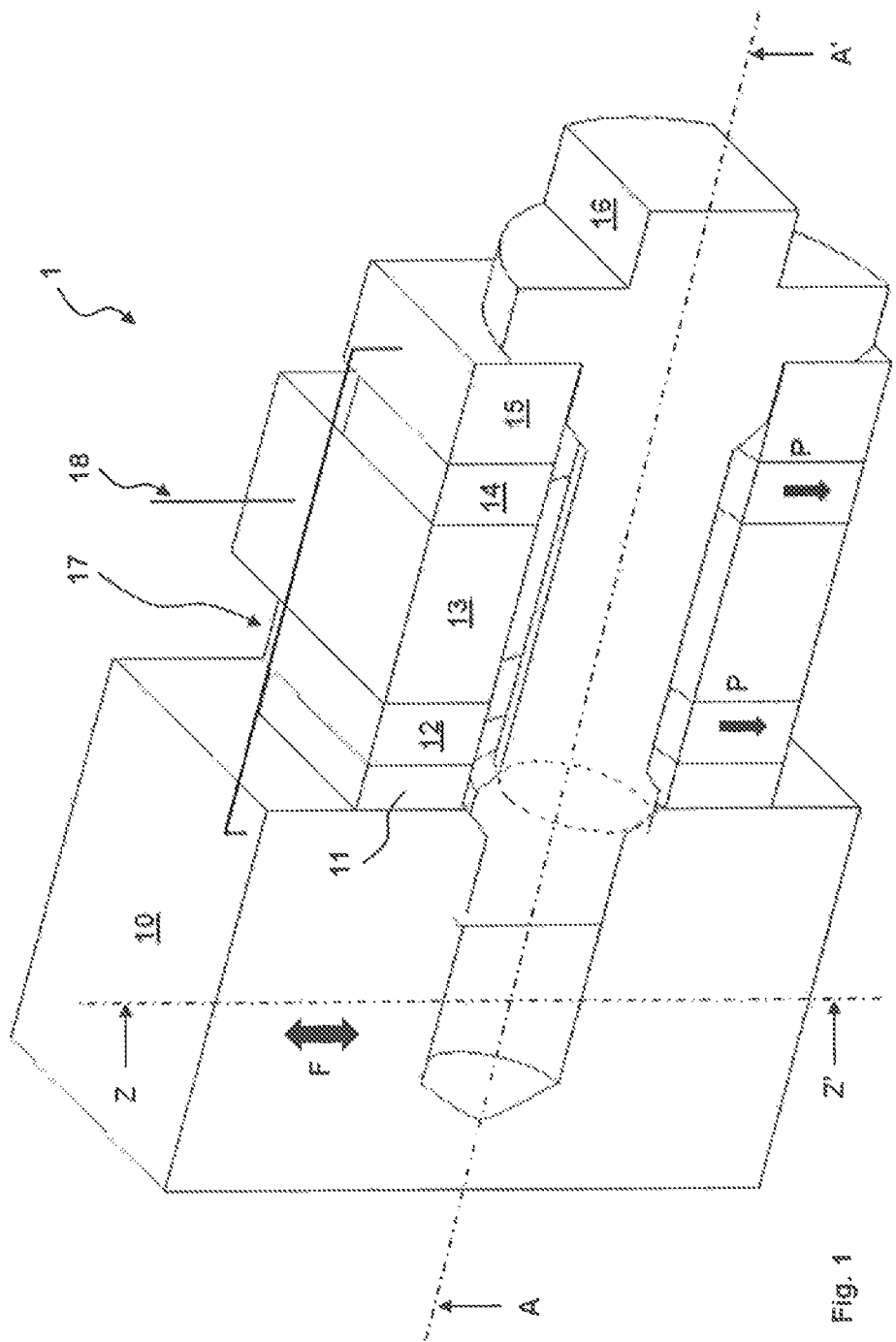
FIG. 1 shows cross-sectional view of a first embodiment of the piezoelectric transducer according to the invention, the piezoelectric transducer has an unbalanced cantilever design with a helicoidal pre-load element and one main piezoelectric ceramic element.

FIGS. 1 to 8 show several exemplary embodiments of a piezoelectric transducer 1 for measuring a force. The piezoelectric transducer 1 comprises several elements and several means. Elements are physical items depicted in the figures. Means are functional items formed by at least one element.

The piezoelectric transducer 1 comprises a base element 10 made from metal material such as steel alloys, titanium alloys, etc. The base element 10 mechanically supports pre-loaded parts of the piezoelectric transducer 1 that are directly or indirectly joined thereto along at least one support axis AA' by means of a pre-loading element 16. The pre-loaded parts of the piezoelectric transducer 1 comprise at least one main piezoelectric ceramic element 12, 12', 12", at least one compensation piezoelectric ceramic element 14, 14', 14", at least one seismic mass element 13, 13', 13", at least one compensation seismic mass element 15, 15', 15". The pre-loaded parts of the piezoelectric transducer 1 may comprise at least one of a spacer element 11, an electric conduction element 19, an electric insulation element 20. A vertical axis ZZ' extends perpendicularly to the support axis AA'. Gravity is exerted along the vertical axis ZZ'. The vertical axis ZZ' extends through the center of the base element 10. The base element 10 serves as reference of the piezoelectric transducer 1.

The pre-loading element 16 is made from metal material such as steel alloys, titanium alloys, etc. The pre-loading element 16 has two preferred embodiments. According to FIGS. 1, 2, 3 and 5 the pre-loading element 16 is helicoidal and embodied as a pre-load screw. The pre-load screw comprises a screw head and an external thread that engages a thread hole. By screwing pre-load screw into the threaded hole, the pre-loaded parts of the piezoelectric transducer 1 are joined against the base element 10. According to FIGS. 1 and 2 the threaded hole is disposed in the base element 10, according to FIGS. 3 and 5 the threaded hole is disposed in a seismic mass element 13. According to FIGS. 4 and 6 to 8 pre-loading element 16 is annular and embodied as a pre-load ring. By pressing or shrinking the pre-load ring over the pre-loaded parts of the piezoelectric transducer 1, the pre-loaded parts are joined against the base element 10.

The main piezoelectric ceramic element 12, 12', 12" and the compensation piezoelectric ceramic element 14, 14', 14" have a cylindrical or rectangular shape. The main piezoelectric ceramic element 12, 12', 12" and the compensation piezoelectric ceramic element 14, 14', 14" are made from piezoelectric material. Piezoelectric material creates electric charge when subjected to a force. Preferably, the piezoelectric material is piezoelectric ceramic like PZT ($Pb(Zr_xTi_{1-x})O_3$ with $0<x<1$)), lead metaniobate ($PbNb_2O_6$, (BaPb)$Nb_2O_6$), bismuth titanate oxide ($Bi_{12}TiO_{20}$, $Bi_4Ti_3O_{12}$, $Bi_3TiNbO_9$, $SrBi_2Nb_2O_9$, $Na_{0.5}Bi_{4.5}Ti_4O_{15}$, $SrBi_4Ti_4O_{15}$, $CaBi_4Ti_4O_{15}$), Perovskite ($Sr_2(Nb_{0.5}Ta_{0.5})_2O_7$), thin film (AlN, ZnO), etc. The main piezoelectric ceramic element 12, 12', 12" has several preferred embodiments. According to FIGS. 1, 5 and 6 it is from one piece, according to FIGS. 2 to 4 and 7 it is from two pieces, according to FIG. 8 it is from three pieces. The compensation piezoelectric ceramic element 14, 14', 14" has several preferred embodiments. According to FIGS. 1, 2, 5 to 7 it is from one piece, according to FIGS. 3, 4 and it is from two pieces, according to FIG. 8 it is from three or more pieces.

In order to show piezoelectric properties, the piezoelectric ceramic must be polarized. Polarization of the piezoelectric ceramic is done by applying a strong electric field at elevated temperatures to the piezoelectric ceramic. Polarization of the piezoelectric ceramic is permanent and shows a polarization direction P of the piezoelectric ceramic that is parallel to the direction of the electric field. In FIGS. 1 to 8, the polarization direction P of the main piezoelectric ceramic element 12, 12', 12" and of the compensation piezoelectric ceramic element 14, 14', 14" is indicated by a one-sided arrow.

Preferably, the piezoelectric ceramic utilizes the shear piezoelectric effect, where electric charge is generated on the same faces of the main piezoelectric ceramic element 12, 12', 12" and of the compensation piezoelectric ceramic element 14, 14', 14" on which a shear force acts. For the shear piezoelectric effect, the shear piezoelectric charge coefficient of the piezoelectric ceramic is called $d_{15}$. The shear piezoelectric effect is strongest, i.e. has the greatest piezoelectric sensitivity, when the polarization direction P of the piezoelectric ceramic is parallel to a force direction F of the shear force. The shear force thus has a force direction F parallel to the vertical axis ZZ'. The force direction F is indicated in FIGS. 1 to 8 by a double-sided arrow. The faces of the main piezoelectric ceramic element 12, 12', 12" and of the compensation piezoelectric ceramic element 14, 14', 14" on which the shear force acts are orthogonal to the support axis AA'. The more main piezoelectric ceramic elements 12, 12', 12" and the more compensation piezoelectric ceramic elements 14, 14', 14" the piezoelectric transducer 1 has, the higher is the piezoelectric sensitivity of the piezoelectric transducer 1.

For each main piezoelectric ceramic element 12, 12', 12" and compensation piezoelectric ceramic element 14, 14', 14' positive electric charge is generated on a first face, negative electric charge is generated on a second face. In present invention, negative electric charge is used as signal electric charge and positive electric charge is used as ground electric charge. This definition is arbitrary and could also be the other way around. The main piezoelectric ceramic element 12, 12', 12" and the compensation piezoelectric ceramic element 14, 14', 14' are oriented with respect to said shear force with opposite polarity. For the main piezoelectric ceramic element 12, 12', 12", the first face is left to the polarization direction P and the second face is right to the polarization direction P. For the compensation piezoelectric ceramic element 14, 14', 14", the first face is right to the polarization direction P and the second face is left to the polarization direction P.

The main piezoelectric ceramic element 12, 12', 12" is made from first piezoelectric ceramic, the compensation piezoelectric ceramic element 14, 14', 14" is made from second piezoelectric ceramic. The first and the second piezoelectric material have different physical properties. The first piezoelectric ceramic has a piezoelectric charge coefficient larger than the second piezoelectric ceramic. Preferably, the second piezoelectric ceramic has a shear piezoelectric charge coefficient $d_{15}$ that is at least three times smaller than the shear piezoelectric charge coefficient $d_{15}$ of the first piezoelectric ceramic. The first piezoelectric ceramic has a thermal sensitivity shift smaller than the second piezoelectric ceramic. Preferably, the first piezoelectric ceramic has a thermal shift sensitivity that is at least ten times smaller than the thermal sensitivity shift of the second piezoelectric ceramic.

A quantity $Q_{main}$ of main electric charge of the main piezoelectric ceramic element 12, 12', 12" depends on the size $d_{15main}$ of the shear piezoelectric charge coefficient $d_{15}$ of the first piezoelectric ceramic, of the weight $M_{main}$ of the effective main seismic mass means and of an acceleration a.

$$Q_{main}=d_{15main}*M_{main}*a$$

A quantity $Q_{comp}$ of compensation electric charge of the compensation piezoelectric ceramic element 14, 14', 14" depends on the size $d_{15comp}$ of the shear piezoelectric charge coefficient $d_{15}$ of the second piezoelectric ceramic, of the weight $M_{comp}$ of the effective compensation seismic mass means and of the acceleration a.

$$Q_{comp}=d_{15comp}*M_{comp}*a$$

The quantity $Q_{main}$ of main electric charge and the quantity $Q_{comp}$ of compensation electric charge are collected with opposite polarity. As the quantity $Q_{main}$ of main electric charge is substantially greater than the quantity $Q_{comp}$ of compensation electric charge, a resulting quantity $Q_{collected}$ of collected electric charges is slightly smaller than the quantity $Q_{main}$ of main electric charge.

$$Q_{collected}=Q_{main}-Q_{comp}$$

Preferably, the first piezoelectric ceramic is made from soft PZT. Preferably, the first piezoelectric ceramic has a shear piezoelectric charge coefficient $d_{15}$ greater than 400 pC/N, at +20° C. Preferably, the first piezoelectric ceramic has a thermal shift sensitivity of the shear piezoelectric charge coefficient $d_{15}$ that increases in the operating temperature range of −54° C. to +260° C. by 20% with respect to the value of the shear piezoelectric charge coefficient $d_{15}$ at +20° C.

Preferably, the second piezoelectric ceramic is made from hard PZT. Preferably, the second piezoelectric ceramic has a shear piezoelectric charge coefficient $d_{15}$ greater than 100 pC/N, at +20° C. Preferably, the second piezoelectric ceramic has a thermal shift sensitivity of the shear piezoelectric charge coefficient $d_{15}$ that increases in the operating temperature range of −54° C. to +260° C. by 300% with respect to the value of the shear piezoelectric charge coefficient $d_{15}$ at +20° C.

Figure 9:
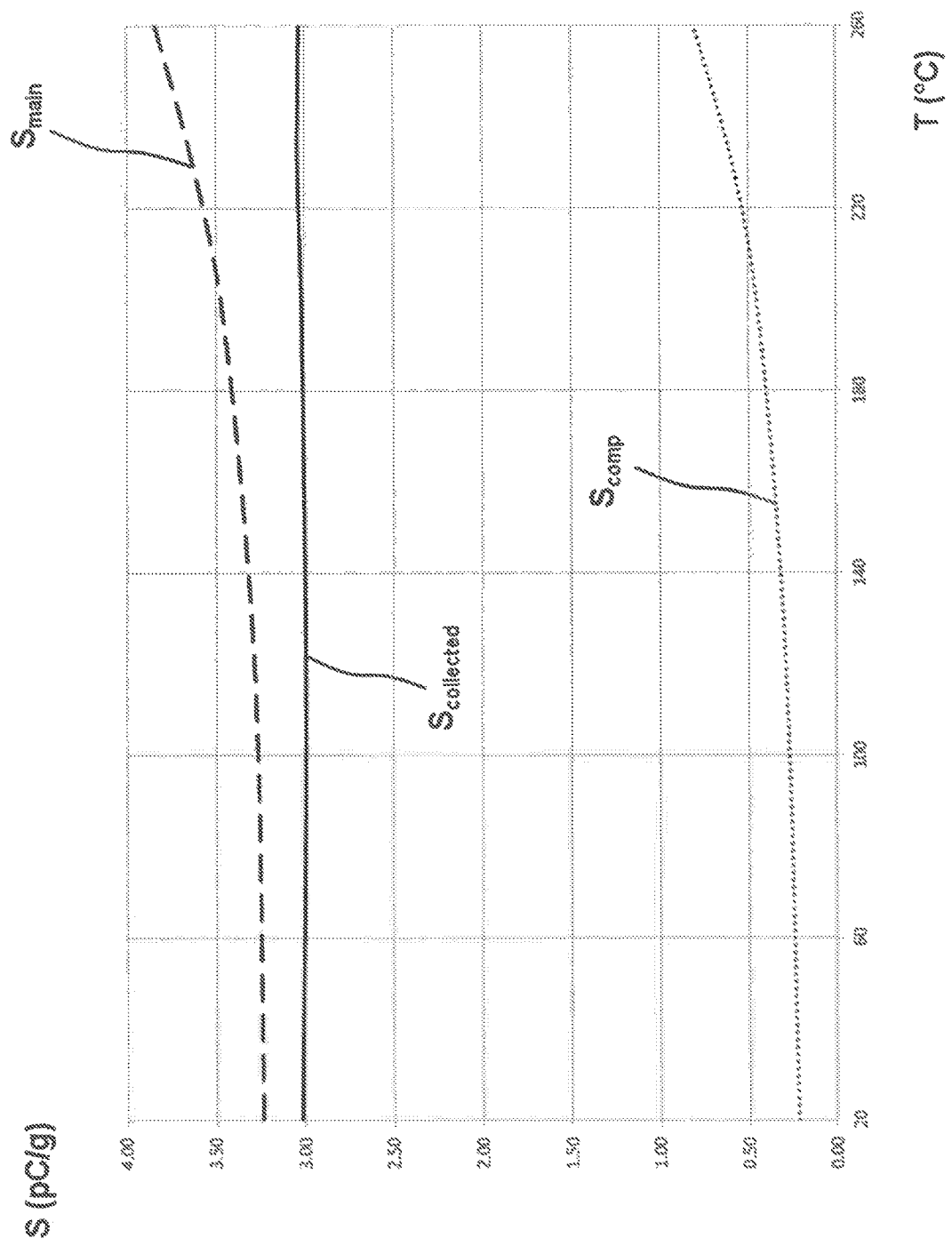
FIG. 9 shows a diagram of the main piezoelectric sensitivity, of a compensation piezoelectric sensitivity and of a collected piezoelectric sensitivity of the piezoelectric transducer according to the invention.

FIG. 9 is a diagram of a main piezoelectric sensitivity $S_{main}$ of the quantity $Q_{main}$ of main electric charge, of compensation piezoelectric sensitivity $S_{comp}$ of the quantity $Q_{comp}$ of compensation electric charges and of a collected piezoelectric sensitivity $S_{collected}$ of the quantity $Q_{collected}$ of collected electric charges in a depicted operating temperature range from +20° C. to +260° C. The piezoelectric sensitivity S is rated in pC/g, with the gravitational acceleration g=9.81 m/sec². The main piezoelectric sensitivity $S_{main}$ is the quantity $Q_{main}$ of main electric charge at a gravitational acceleration of one g. The compensation piezoelectric sensitivity $S_{comp}$ is the quantity $Q_{comp}$ of compensation electric charges at a gravitational acceleration of one g. The collected piezoelectric sensitivity $S_{collected}$ is the quantity $Q_{collected}$ of collected electric charges at a gravitational acceleration of one g. T designates the temperature. Preferably, the main piezoelectric sensitivity $S_{main}$ amounts to 3.25 pC/g at +20° C. and to 3.8 pC/g at +260° C. Preferably, the compensation piezoelectric sensitivity $S_{comp}$ amounts to 0.2 pC/g at +20° C. and to 0.75 pC/g at +260° C. Collection of oppositely poled electric charges of the main piezoelectric ceramic element 12, 12', 12" and of the compensation piezoelectric ceramic element 14, 14', 14" results in a collected piezoelectric sensitivity $S_{collected}$ that remains almost stable at 3.0 pC/g in the depicted operating temperature range from +20° C. to +260° C.

Figure 10:
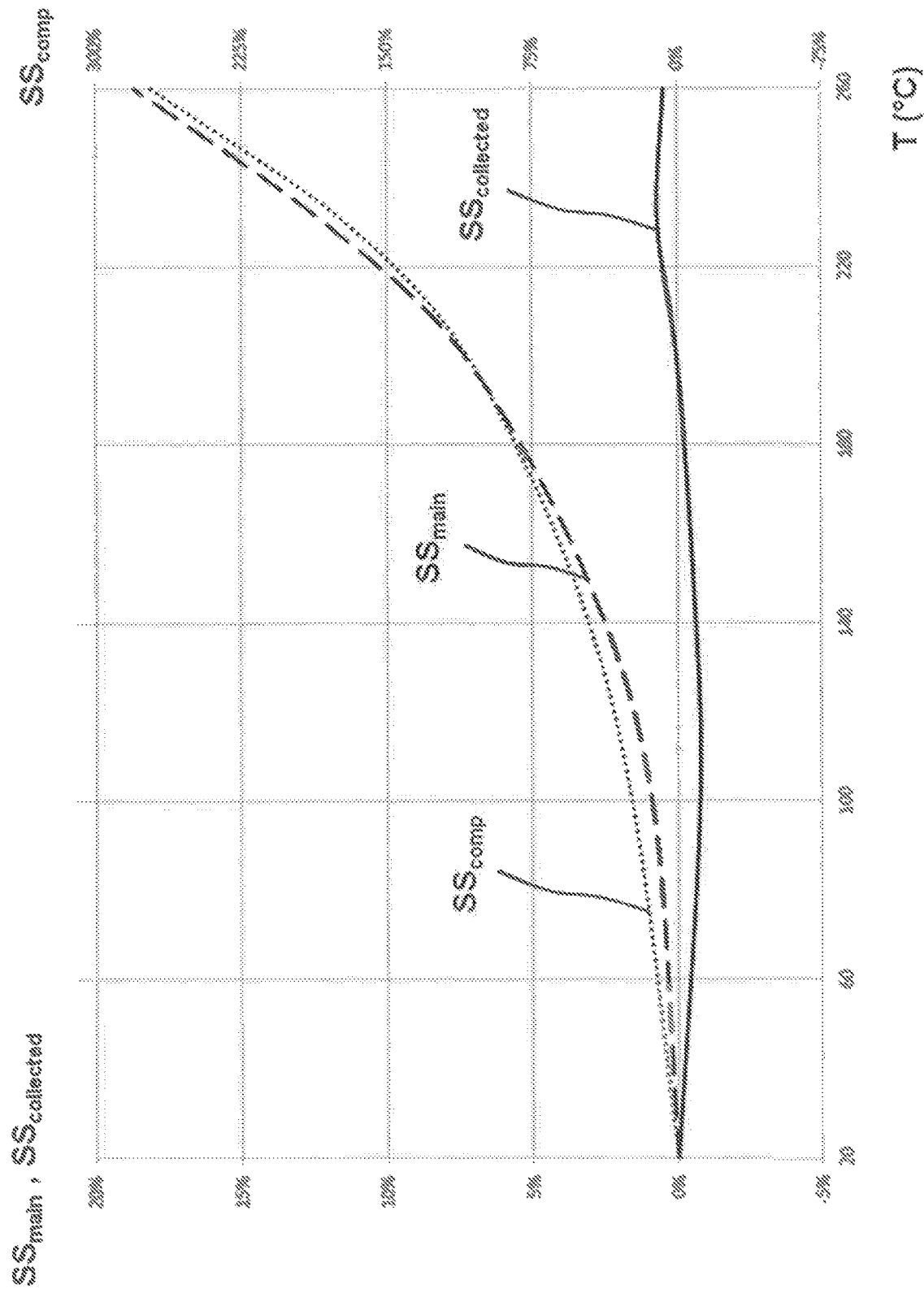
FIG. 10 shows a diagram of a main thermal sensitivity shift, of a compensation thermal shift and of a collected thermal shift of the piezoelectric transducer according to the invention.

FIG. 10 is a diagram of thermal sensitivity shifts in a depicted operating temperature range from +20° C. to +260° C. $SS_{main}$ designates a main thermal sensitivity shift of the main piezoelectric sensitivity $S_{main}$ at a temperature T within the limits of the operating temperature range of the first piezoelectric material referenced to the main piezoelectric sensitivity $S_{main}$ at +20° C.

$$SS_{main}=(S_{main}(T)-S_{main}(20°\ C.))/S_{main}(20°\ C.)$$

$SS_{comp}$ designates a compensation thermal sensitivity shift of the compensation piezoelectric sensitivity $S_{comp}$ at a temperature T within the limits of the operating temperature range of the second piezoelectric material referenced to the compensation piezoelectric sensitivity $S_{comp}$ at +20° C.

$$SS_{comp}=(S_{comp}(T)-S_{comp}(20°\ C.))/S_{comp}(20°\ C.)$$

$SS_{collected}$ designates a collected thermal sensitivity shift of the collected piezoelectric sensitivity $S_{collected}$ at a temperature T within the limits of the operating temperature range of the first and second piezoelectric material referenced to the collected piezoelectric sensitivity $S_{collected}$ at +20° C.

$$SS_{collected}=(S_{collected}(T)-S_{collected}(20°\ C.))/S_{collected}(20°\ C.)$$

The scale of the main thermal sensitivity shift $SS_{main}$ and of the collected thermal sensitivity shift $SS_{collected}$ is plotted on the left ordinate. The scale of the compensation thermal sensitivity shift $SS_{comp}$ is plotted on the right ordinate. The compensation thermal sensitivity shift $SS_{comp}$ is substantially higher than the main thermal sensitivity shift $SS_{main}$. The compensation thermal sensitivity shift $SS_{comp}$ increases in the depicted operating temperature range of +20° C. to +260° C. by 260% and the main thermal sensitivity shift $SS_{main}$ increases in the depicted operating temperature range of +20° C. to +260° C. by 18%. The collected thermal sensitivity shift $SS_{collected}$ remains almost stable at 0% in the depicted operating temperature range from +20° C. to +260° C.

The spacer element 11, the seismic mass element 13, 13', 13", the compensation seismic mass element 15, 15', 15" and the electric conduction element 19 have a cylindrical or rectangular shape. The spacer element 11, the seismic mass element 13, 13', 13", the compensation seismic mass element 15, 15', 15" and the electric conduction element 19 are made from metal material such as steel alloys, titanium alloys, etc. The seismic mass element 13, 13', 13" has several preferred embodiments. According to FIGS. 1, 2, 5 and 6 it is from one piece, according to FIGS. 3, 4 and 7 it is from two pieces, according to FIG. 8 it is from three pieces. The compensation seismic mass element 15, 15', 15" has several preferred embodiments. According to FIGS. 1, 2 and 5 to 7 it is from one piece, according to FIGS. 3 and 4 and it is from two pieces, according to FIG. 8 it is from three pieces. Preferably, the weight of the seismic mass element 13, 13', 13" is greater than the weight of the compensation seismic mass element 15, 15', 15".

The electric insulation element 20 has a cylindrical or rectangular shape. The electric insulation element 20 is made from electric insulation material such as polytretrafluorethylene, polyimide, aluminum oxide, magnesium oxide, etc.

An effective main seismic mass means is capable of producing the force to be measured when being accelerated. Acceleration due to inertia of the effective main seismic mass means occurs along the vertical axis ZZ'. The force to be measured acts as a shear force on the main piezoelectric ceramic element 12, 12', 12". The effective main seismic mass means is composed by all the pre-loaded parts arranged on the side of the main piezoelectric ceramic element 12, 12', 12" that faces away from the base element 10. The weight of the effective main seismic mass creates a permanent small gravity force in the order of $10^{-6}$ g. For measuring small accelerations, the small gravity force due to the weight of the effective main seismic mass must be compensated by a compensation force. A compensation seismic mass means is capable of producing the compensation force when being accelerated. Acceleration due to inertia of the compensation seismic mass means occurs also along the vertical axis ZZ'. The compensation force acts as a shear force on the compensation piezoelectric ceramic element 14, 14', 14". The compensation seismic mass means is composed by all the pre-loaded parts arranged on the side of the compensation piezoelectric ceramic element 14, 14', 14" that faces away from the base element 10.

Ground means 17 and signal means 18 are capable of collecting main electric charge generated on the faces where a force to be measured is applied on the main piezoelectric ceramic element 12, 12', 12". The ground means 17 and the signal means 18 are also capable of collecting compensation electric charge generated on the faces where a compensation force is applied on the compensation piezoelectric ceramic element 14, 14', 14". The ground means 17 and the signal means 18 are formed by at least one element. Preferably, ground means 17 collect positive electric main charge from the first face of the main piezoelectric ceramic element 12, 12', 12" and positive electric compensation charge from the first face of the compensation piezoelectric ceramic element 14, 14', 14". Preferably, signal means 18 collect negative main electric charge from the second face of the main piezoelectric ceramic element 12, 12', 12" and negative compensation electric charge from the second face of the compensation piezoelectric ceramic element 14, 14', 14".

The ground means 17 and the signal means 18 are joined against the first and second faces of the main piezoelectric ceramic element 12, 12', 12" and of the compensation piezoelectric ceramic element 14, 14', 14", such that they are in surface contact with the faces where the shear force acts. The piezoelectric transducer 1, thus has a high rigidity along the support axis AA' and the first and second faces of the main piezoelectric ceramic element 12, 12', 12" and of the compensation piezoelectric ceramic element 14, 14', 14" are in close mechanical contact with the ground means 17 and the signal means 18. A close mechanical contact minimizes or eliminates any micro-gaps between the first and second faces of the main piezoelectric ceramic element 12, 12', 12" and of the compensation piezoelectric ceramic element 14, 14', 14" and the ground means 17 and the signal means 18 and thus assures a clearly defined capacitance of the piezoelectric transducer 1.

The ground means 17 is electrically connected to a signal electric charge input of an evaluation unit. The signal means 18 is electrically connected to a ground electric charge input of the evaluation unit. The electric connections of the ground means 17 and the signal means 18 may be realized by wire elements from electric conductive material such as copper, platinum-tungsten, etc. In FIGS. 1 to 8 part of the wire elements are schematically represented by lines that connect the at least one element of a ground means 17 or of a signal means 18. The wire elements are electrically and mechanically connected to the ground means 17 and the signal means 18. The wire elements may be electrically insulated by a sheath from electric insulation material such as polyvinyl-chloride, rubber, etc. Thus, ground electric charge collected by the ground means 17 and signal electric charge collected by the signal means 18 are transmitted by wires to the evaluation unit. The evaluation unit is not depicted in the figures. The evaluation unit may electrically amplify the transmitted signal electric charge collected by the signal means 18. The evaluation unit may also evaluate or digitize the electrically amplified signal electric charge.

First and Second Exemplary Embodiments

Figure 2:
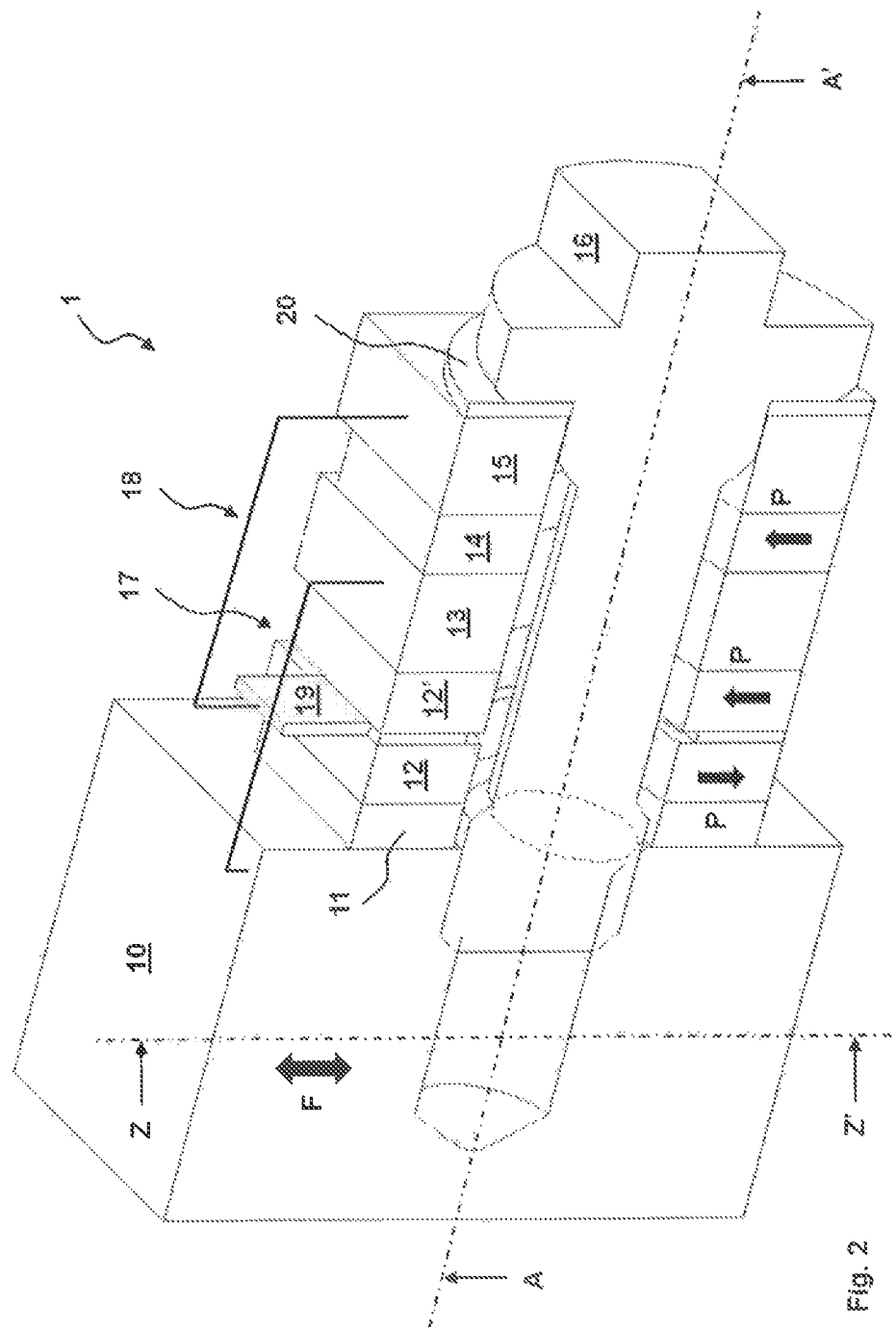
FIG. 2 shows cross-sectional view of a second embodiment of the piezoelectric transducer according to the invention, the piezoelectric transducer has an unbalanced cantilever design with a helicoidal pre-load element and two main piezoelectric ceramic elements.

FIGS. 1 and 2 show two exemplary embodiments of a piezoelectric transducer 1 with a cantilever design. In the cantilever design, the pre-loaded parts of the piezoelectric transducer 1 are joined by means of the pre-loading element 16 along support axis AA' against one face of the base element 10. The cantilever design is unbalanced, which means that all the weight of the pre-loaded parts hangs due to gravity on the side of the one face of the base element 10.

In FIG. 1 the pre-loaded parts are arranged along the support axis AA' between the base element 10 and the screw head of the pre-loading element 16. This arrangement occurs in the following order of increasing distance with respect to the base element 10: one spacer element 11, one main piezoelectric ceramic element 12, one seismic element 13, one compensation piezoelectric ceramic element 14 and one compensation seismic mass element 15. In FIG. 1 the effective main seismic mass means is composed by the following pre-loaded parts: a portion of the main piezoelectric ceramic element 12, the seismic mass element 13, the compensation piezoelectric ceramic element 14, the compensation seismic mass element 15 and a portion of the pre-load element 16 arranged on the side of the main piezoelectric ceramic element 12 that faces away from the base element 10. In FIG. 1 the effective compensation seismic mass means is composed by the following pre-loaded parts: the compensation seismic mass element 15 and a portion of the pre-load element 16 arranged on the side of the compensation piezoelectric ceramic element 14 that faces away from the base element 10. In FIG. 1 the ground means 17 is formed by the base element 10, the spacer element 11 and the compensation seismic mass element 15. In FIG. 1 the signal means 18 is formed by the seismic mass element 13.

In FIG. 2 the pre-loaded parts are arranged along the support axis AA' between the base element 10 and the screw head of the pre-loading element 16. This arrangement occurs in the following order of increasing distance with respect to the base element 10: one spacer element 11, a first main piezoelectric ceramic element 12, one electric conduction element 19, a second main piezoelectric element 12', one seismic mass element 13, one compensation piezoelectric ceramic element 14, one compensation seismic mass element 15 and one electric insulation element 20. In FIG. 2 the effective main seismic mass means is composed by the following pre-loaded parts: two portions of the two main piezoelectric ceramic elements 12, 12', a portion of the electric conduction element 19, the seismic mass element 13, the compensation piezoelectric ceramic element 14, the compensation seismic mass element 15, the electric insulation element 20 and a portion of the pre-load element 16 arranged on the side of the first main piezoelectric ceramic element 12 that faces away from the base element 10. In FIG. 2 the effective compensation seismic mass means is composed by the following pre-loaded parts: the compensation seismic mass element 15 and a portion of the pre-load element 16 arranged on the side of the compensation piezoelectric ceramic element 14 that faces away from the base element 10. In FIG. 2 the ground means 17 is formed by the base element 10, the spacer element 11 and the compensation seismic mass element 15. In FIG. 2 the signal means 18 is formed by the seismic mass element 13.

The unbalanced cantilever design of the first and second exemplary embodiments, thus show a piezoelectric transducer 1 with very few elements and parts. Because of the few elements and parts, the assembly of this piezoelectric transducer 1 is easy and fast, which results in low manufacturing costs. The piezoelectric transducer 1 of FIG. 2 has two main piezoelectric ceramic elements 12, 12' and thus a smaller main seismic mass element 13 may be used. This will provide an increased element resonant frequency and yield better performance as far as frequency response at high frequencies.

Third and Fourth Exemplary Embodiments

Figure 3:
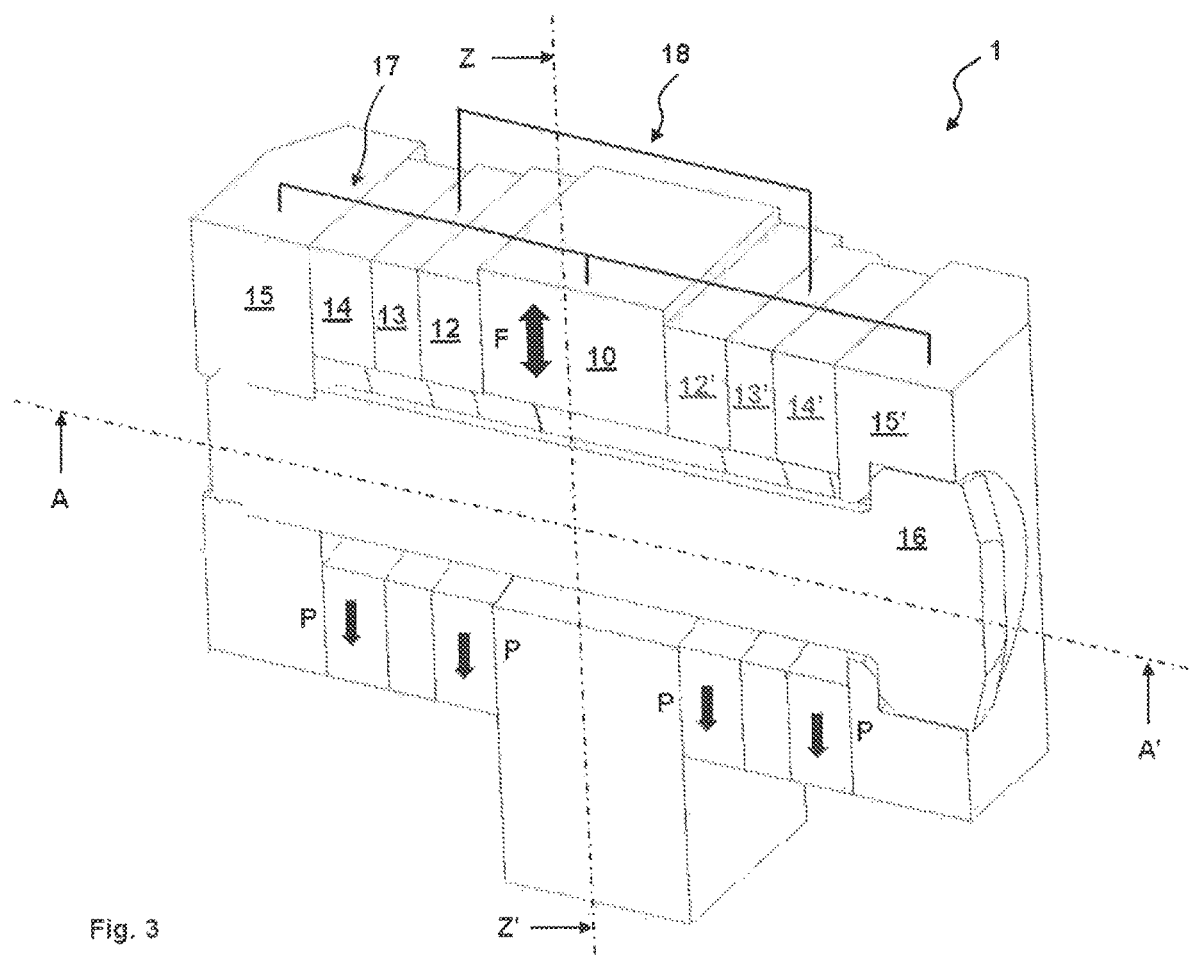
FIG. 3 shows cross-sectional view of a third embodiment of the piezoelectric transducer according to the invention, the piezoelectric transducer has a balanced double cantilever design with a helicoidal pre-load element and two main piezoelectric ceramic elements.
Figure 4:
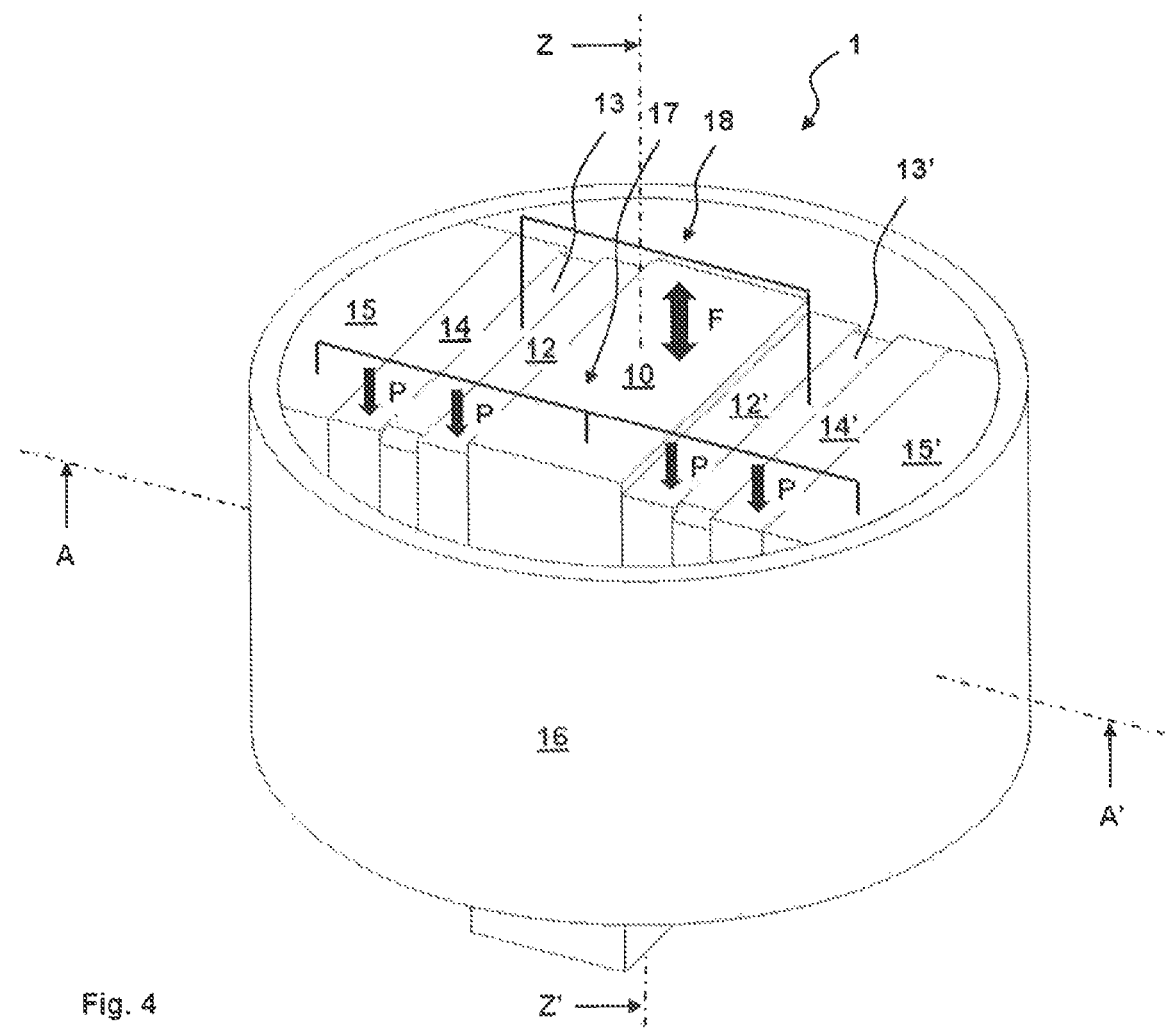
FIG. 4 shows cross-sectional view of a fourth embodiment of the piezoelectric transducer according to the invention, the piezoelectric transducer has a balanced double cantilever design with an annular pre-load element and two main piezoelectric ceramic elements.

FIGS. 3 and 4 show two exemplary embodiments of a piezoelectric transducer 1 with a double cantilever design. In the double cantilever design, the pre-loaded parts of the piezoelectric transducer 1 are joined by means of the pre-loading element 16 along support axis AA' against two faces of the base element 10. The double cantilever design is balanced, which means that the weight of the pre-loaded parts hangs due to gravity equally distributed on the two faces of the base element 10. While in FIG. 3 the pre-loading element 16 is embodied as a pre-load screw, in FIG. 4 the pre-loading element 16 is embodied as a pre-load ring.

In FIGS. 3 and 4 the pre-loaded parts are equally arranged along the support axis AA' between two faces of the base element 10 and the screw head of the pre-loading element 16 (FIG. 3) respectively the annular pre-load element 16 (FIG. 4). These arrangements occur in an order of increasing distance with respect to the base element 10. For each face of the base element 10, the arrangement has the following order: one main piezoelectric ceramic element 12, 12', one seismic element 13, 13', one compensation piezoelectric ceramic element 14, 14' and one compensation seismic mass element 15, 15'. In FIGS. 3 and 4 the effective main seismic mass means is composed by the following pre-loaded parts: two portions of the two main piezoelectric ceramic elements 12, 12', the two seismic mass elements 13, 13', the two compensation piezoelectric ceramic elements 14, 14', the two compensation seismic mass elements 15, 15' and the two portions of the pre-load element 16 arranged on the sides of the two main piezoelectric ceramic elements 12, 12' that face away from the base element 10. In FIGS. 3 and 4 the effective compensation seismic mass means is composed by the following pre-loaded parts: the two compensation seismic mass elements 15, 15' and two portions of the pre-load elements 16 arranged on the sides of the two compensation piezoelectric ceramic elements 14, 14' that face away from the base element 10. In FIGS. 3 and 4 the ground means 17 is formed by the two compensation seismic mass elements 15, 15'. In FIGS. 3 and 4 the signal means 18 is formed by the two seismic mass elements 13, 13'.

The balanced double cantilever design of the third and fourth exemplary embodiments, thus show a piezoelectric transducer 1 with two main piezoelectric ceramic elements 12, 12' and two compensation piezoelectric ceramic elements 14, 14' and thus a high piezoelectric sensitivity of the piezoelectric transducer 1.

Fifth and Sixth Exemplary Embodiments

Figure 5:
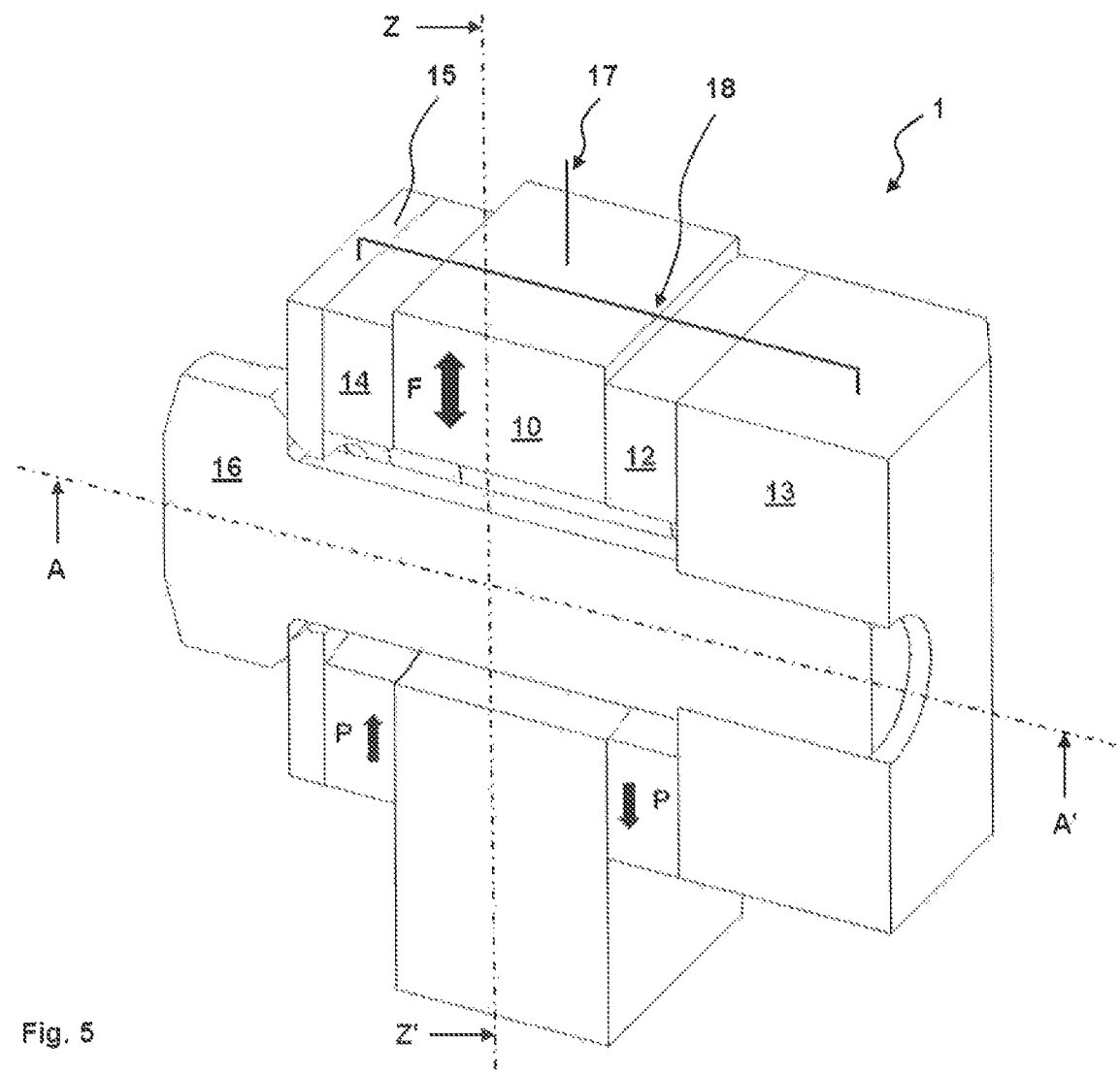
FIG. 5 shows cross-sectional view of a fifth embodiment of the piezoelectric transducer according to the invention, the piezoelectric transducer has an unbalanced double cantilever design with a helicoidal pre-load element and one main piezoelectric ceramic element.
Figure 6:
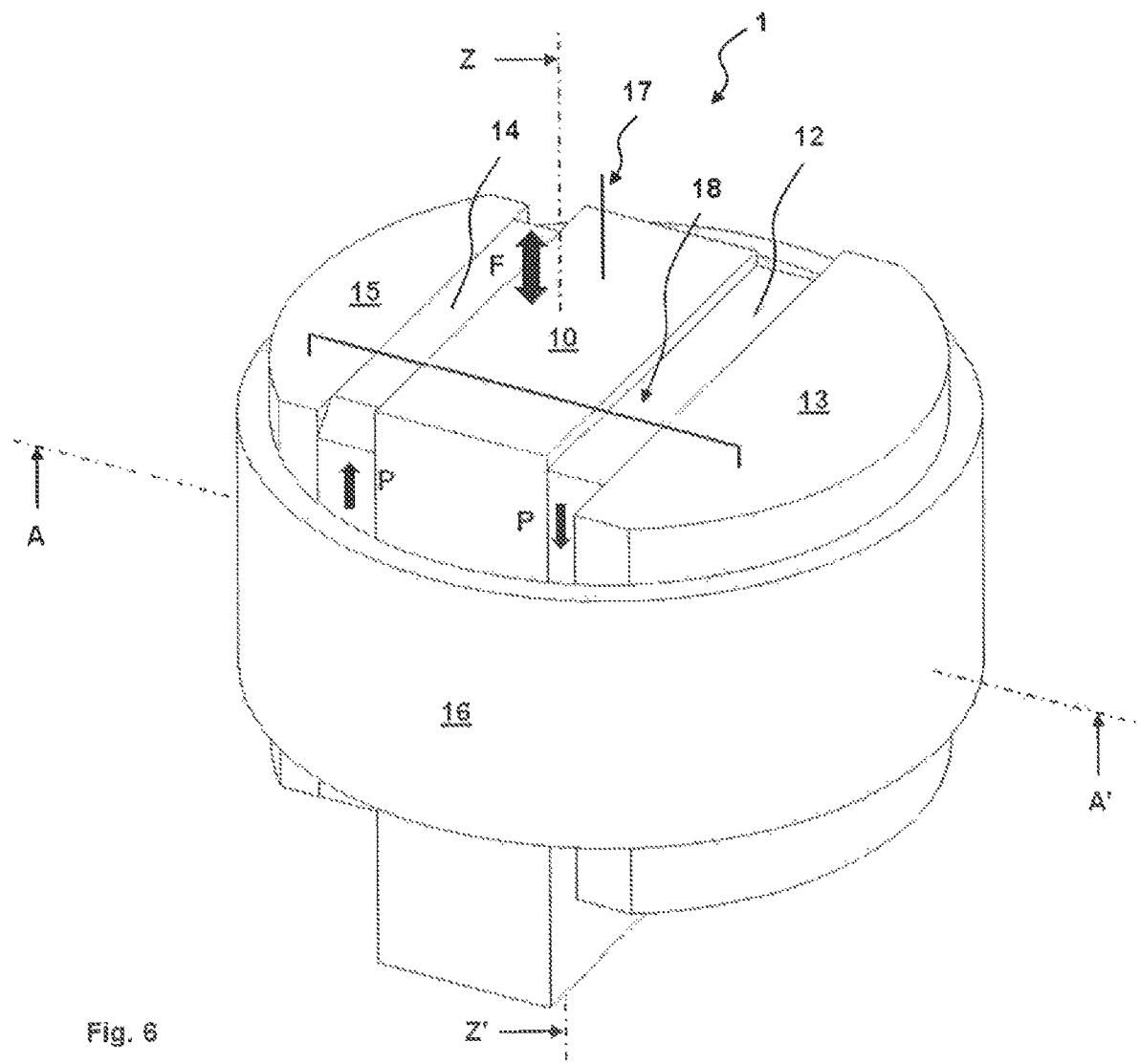
FIG. 6 shows cross-sectional view of a sixth embodiment of the piezoelectric transducer according to the invention, the piezoelectric transducer has an unbalanced double cantilever design with an annular pre-load element and one main piezoelectric ceramic element.

FIGS. 5 and 6 show two exemplary embodiments of a piezoelectric transducer 1 with a double cantilever design. In the cantilever design, the pre-loaded parts of the piezoelectric transducer 1 are joined by means of the pre-loading element 16 along support axis AA' against two faces of the base element 10. The cantilever design is unbalanced, which means that the weight of the pre-loaded parts hangs due to gravity unequally distributed on the two faces of the base element 10. While in FIG. 5 the pre-loading element 16 is embodied as a pre-load screw, in FIG. 6 the pre-loading element 16 is embodied as a pre-load ring.

In FIGS. 5 and 6 the pre-loaded parts are arranged along the support axis AA' between a seismic mass element 13 and the screw head of the pre-loading element 16 (FIG. 5) respectively the annular pre-load element 16 (FIG. 6). These arrangements occur in an order of increasing distance with respect to the base element 10. On a first face of the base element 10 that is on the side of the base element 10 that faces towards the seismic mass element 13, the arrangement has the following order: one main piezoelectric ceramic element 12 and the one main seismic element 13. On a second face of the base element 10 that is on the side of the base element 10 that faces away from the seismic mass element 13, the arrangement has the following order: one compensation piezoelectric ceramic element 14 and one compensation seismic mass element 15. In FIGS. 5 and 6 the effective main seismic mass means is composed by a portion of the main piezoelectric ceramic element 12, the one seismic mass element 13 and a portion of the pre-load element 16 arranged on the side of the main piezoelectric ceramic element 12 that face away from the base element 10. In FIGS. 5 and 6 the effective compensation seismic mass means is composed by the one compensation seismic mass element 15 and a portion of the pre-load element 16 arranged on the side of the compensation piezoelectric ceramic element 14 that faces away from the base element 10. In FIGS. 5 and 6 the ground means 17 is formed by the base element 10. In FIGS. 5 and 6 the signal means 18 is formed by the one seismic mass element 13 and the one compensation seismic mass element 15.

The unbalanced double cantilever design of the fifth and sixth exemplary embodiments, thus show a piezoelectric transducer 1 with very few elements and parts. Because of the few elements and parts, the assembly of this piezoelectric transducer 1 is easy and fast, which results in low manufacturing costs.

Seventh and Eighth Exemplary Embodiments

Figure 7:
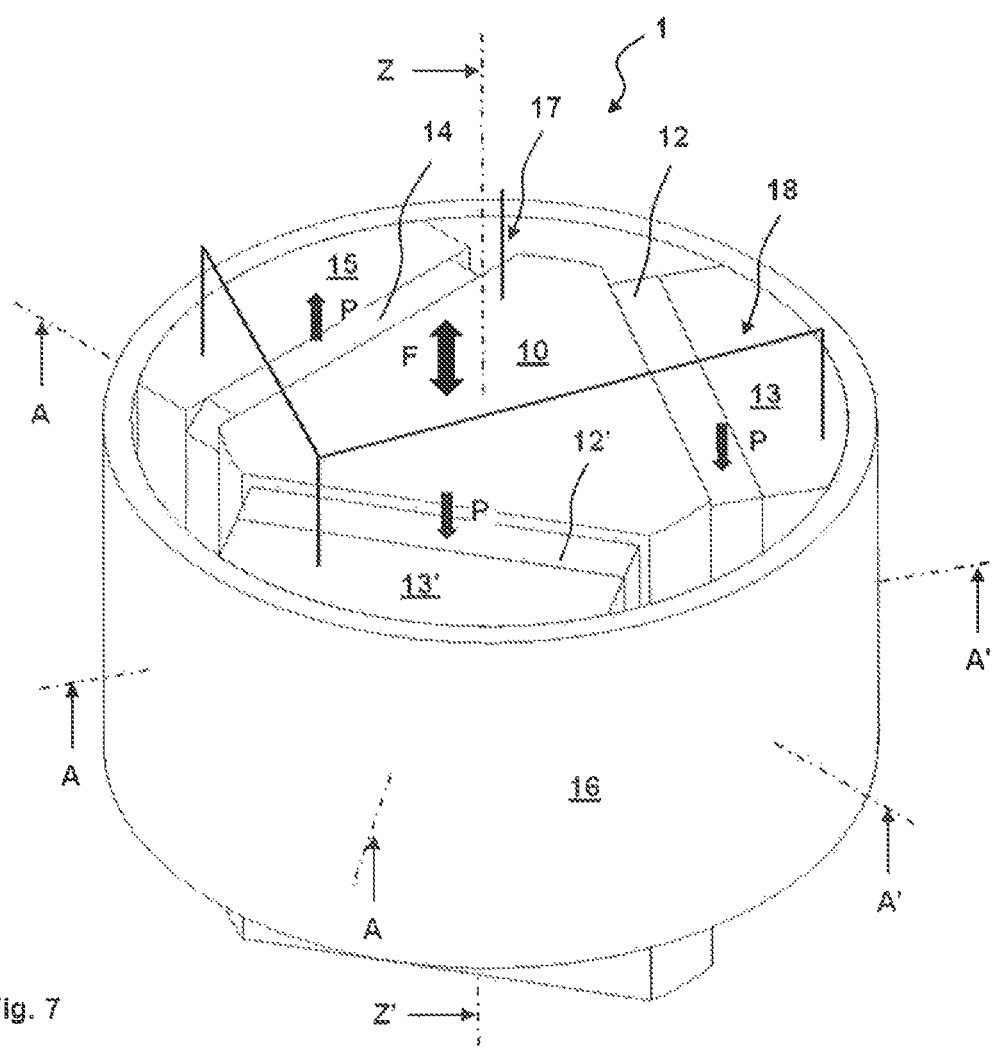
FIG. 7 shows cross-sectional view of a seventh embodiment of the piezoelectric transducer according to the invention, the piezoelectric transducer has a balanced triangular design with an annular pre-load element and two main piezoelectric ceramic elements.
Figure 8:
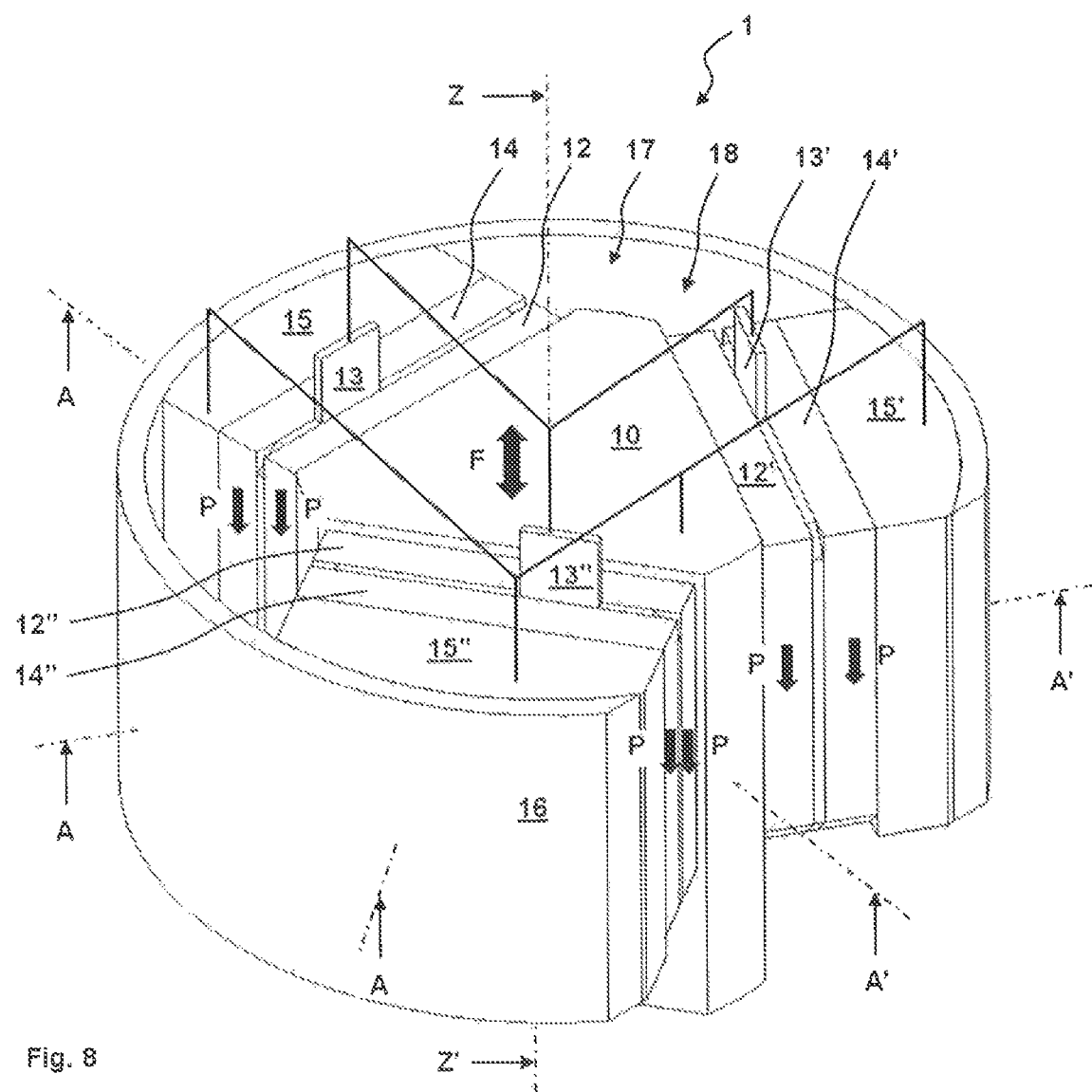
FIG. 8 shows cross-sectional view of an eighth embodiment of the piezoelectric transducer according to the invention, the piezoelectric transducer has a balanced triangular design with an annular pre-load element and three main piezoelectric ceramic elements.

FIGS. 7 and 8 show two exemplary embodiments of a piezoelectric transducer 1 with a triangular design. In the triangular design, the pre-loaded parts of the piezoelectric transducer 1 are joined by means of the pre-loading element 16 along three support axes AA' against three faces of the base element 10. The base element 10 is centrally arranged in the pre-loading element 16 being embodied as a pre-load ring. The three support axes AA' are arranged in a horizontal plane perpendicular to the vertical axis ZZ'. In the horizontal plane, the three support axes AA' are equally spaced apart by an angle of 120° from each other. The triangular design is balanced, which means that the weight of the pre-loaded parts hangs due to gravity equally distributed on the three faces of the base element 10.

In FIG. 7 the pre-loaded parts are arranged along three support axes AA' between the base element 10 and the annular pre-loading element 16. This arrangement occurs in an order of increasing distance with respect to the base element 10. For two faces of the three faces of the base element 10, the arrangement has the following order: one main piezoelectric ceramic element 12, 12', one seismic element 13, 13'. For one face of the three faces of the base element 10, the arrangement has the following order: one compensation piezoelectric ceramic element 14 and one compensation seismic mass element 15. In FIG. 7 the effective main seismic mass means is composed by the following pre-loaded parts: two portions of the two main piezoelectric ceramic elements 12, 12', a portion of the compensation piezoelectric element 14, the two seismic mass elements 13, 13' and a portion of the pre-load element 16 arranged on the side of the main piezoelectric ceramic element 12 that faces away from the base element 10. In FIG. 7 the effective compensation seismic mass means is composed by the following pre-loaded parts: one compensation seismic mass element 15 and a portion of the pre-load element 16 arranged on the side of the compensation piezoelectric ceramic element 14 that faces away from the base element 10. In FIG. 7 the ground means 17 is formed by the base element 10. In FIG. 7 the signal means 18 is formed by the two seismic mass elements 13, 13' and the compensation seismic mass element 15.

In FIG. 8 the pre-loaded parts are arranged along three support axes AA' between the base element 10 and the annular pre-loading element 16. This arrangement occurs in an order of increasing distance with respect to the base element 10. For each of the three faces of the base element 10, the arrangement has the following order: one main piezoelectric ceramic element 12, 12', 12", one seismic mass element 13, 13', 13", one compensation piezoelectric ceramic element 14, 14', 14" and one compensation seismic mass element 15, 15', 15". In FIG. 8 the effective main seismic mass means is composed by the following pre-loaded parts: three portions of the three main piezoelectric ceramic elements 12, 12', 12", the three seismic mass elements 13, 13', 13", the three compensation piezoelectric ceramic elements 14, 14', 14", the three compensation seismic mass elements 15, 15', 15" and portions of the pre-load element 16 arranged on the sides of the three main piezoelectric ceramic elements 12, 12', 12" that face away from the base element 10. In FIG. 8 the effective compensation seismic mass means is composed by the following pre-loaded parts: the three compensation seismic mass elements 15, 15', 15" and portions of the pre-load element 16 arranged on the sides of the three compensation piezoelectric ceramic elements 14, 14, 14" that face away from the base element 10. In FIG. 8 the ground means 17 is formed by the base element 10 and by all three compensation seismic mass elements 15, 15', 15" which are all connected electrically by pre-load element 16. In FIG. 8 the signal means 18 is formed by the three seismic mass elements 13, 13', 13".

The balanced triangular design of the seventh and eighth exemplary embodiments, thus show a piezoelectric transducer 1 with a high piezoelectric sensitivity to volume ratio. Taking the volume inside the annular pre-load element 16 as reference, the piezoelectric transmitter 1 of FIG. 8 with three main piezoelectric ceramic elements 12, 12', 12" and three compensation piezoelectric ceramic elements 14, 14', 14" thus a higher piezoelectric sensitivity than the piezoelectric transducer 1 of FIG. 6 with one piezoelectric ceramic element 12 and one compensation piezoelectric ceramic element 14, or than the piezoelectric transducer 1 of FIG. 7 with two piezoelectric ceramic elements 12, 12' and one compensation piezoelectric ceramic element 14, or than the piezoelectric transducer 1 of FIG. 4 with two piezoelectric ceramic elements 12, 12' and two compensation piezoelectric ceramic elements 14, 14'.

While exemplary embodiments have been disclosed hereinabove, the present invention is not limited to the disclosed embodiments. Instead present invention covers any variations, uses, or adaptations of this disclosure using its general principles. Further, the present invention is intended to cover such departures from this disclosure as come within known or customary practice in the art to which the present invention pertain and which fall within the limits of the appended claims.

Thus, the present invention is not limited to the exploitation of the shear piezoelectric effect, the man skilled in the art may also use the longitudinal piezoelectric effect, where same as for the shear piezoelectric effect, electric charge is generated on the same faces of the main piezoelectric ceramic element and of the compensation piezoelectric ceramic element on which the force is applied. The corresponding longitudinal piezoelectric charge coefficient of the piezoelectric ceramic is called $d_{33}$. Also, the man skilled in the art may also use the transverse piezoelectric effect, where electric charge is generated on the faces of the main piezoelectric ceramic element and of the compensation piezoelectric ceramic element that are perpendicular to the faces on which the force is applied. The corresponding transverse piezoelectric charge coefficient of the piezoelectric ceramic is called $d_{31}$.

Moreover, the present invention is not limited to the eight exemplary embodiments as depicted in the figures. The man skilled in the art may alter FIG. 8 and replace two of the three compensation piezoelectric ceramic elements by two main piezoelectric ceramic elements. The two replacing main piezoelectric ceramic elements would have polarization directions that are opposite to the polarization directions of the three existing main piezoelectric ceramic elements. Also, the spacer element in FIG. 1 is optional and may be omitted. The man skilled in the art may use more than one spacer element.

The invention claimed is:
1. A piezoelectric transducer for measuring a force comprising
a base element;
a pre-loading element;
at least one effective main seismic mass means capable of producing said force when being accelerated, said effective main seismic mass means being joined by said pre-load element directly or indirectly against said base element;
a main piezoelectric ceramic element comprising first piezoelectric ceramic, said first piezoelectric ceramic is capable of generating a main electric charge when subjected to said force, said main piezoelectric ceramic element being joined by said pre-load element directly or indirectly against said effective main seismic mass means;
at least one compensation seismic mass means capable of producing a compensation force when being accelerated, said compensation seismic mass means being joined by said pre-load element directly or indirectly against said base element;
a compensation piezoelectric ceramic element comprising second piezoelectric ceramic, said second piezoelectric ceramic is capable of generating a compensation electric charge when subjected to said compensation force, said compensation piezoelectric ceramic element being joined by said pre-load element directly or indirectly against said compensation seismic mass means;
said first piezoelectric ceramic has a thermal sensitivity shift smaller than said second piezoelectric ceramic;
said first piezoelectric ceramic generates main electric charge that is larger in quantity than compensation electric charge generated by said second piezoelectric ceramic; and
said main piezoelectric ceramic element being oriented with respect to said force to be measured and said compensation piezoelectric ceramic element being oriented with respect to said compensation force such that said main electric charge and said compensation electric charge are opposite in polarity.

2. The piezoelectric transducer of claim 1, wherein said first piezoelectric ceramic has a thermal sensitivity shift at least five times smaller than said second piezoelectric ceramic.

3. The piezoelectric transducer of claim 2, wherein said first piezoelectric ceramic is made from soft PZT with a thermal sensitivity shift of a shear piezoelectric charge coefficient $d_{15}$ that increases in an operating temperature range by 20% with respect to the value of said shear piezoelectric charge coefficient $d_{15}$ at +20° C. and/or said second piezoelectric element is made from hard PZT with a thermal sensitivity shift of a shear piezoelectric charge coefficient $d_{15}$ that increases in an operating temperature range by 300% with respect to the value of said shear piezoelectric charge coefficient $d_{15}$ at +20° C.

4. The piezoelectric transducer of claim 1, wherein said first piezoelectric ceramic has a greater piezoelectric charge coefficient than said second piezoelectric ceramic.

5. The piezoelectric transducer of claim 4, wherein said first piezoelectric ceramic has a piezoelectric charge coefficient at least two times greater than said second piezoelectric ceramic.

6. The piezoelectric transducer of claim 5, wherein said first piezoelectric ceramic is made from soft PZT with a shear piezoelectric charge coefficient $d_{15}$ greater than 400 pC/N at +20° C. and/or said second piezoelectric element is made from hard PZT with a shear piezoelectric charge coefficient $d_{15}$ greater than 100 pC/N at +20° C.

7. The piezoelectric transducer of claim 1, wherein said piezoelectric transducer exploits a shear piezoelectric effect, where electric charge is generated on the same faces of said main piezoelectric ceramic element and of said compensation piezoelectric ceramic element on which a shear force acts; said main piezoelectric ceramic element and said compensation piezoelectric ceramic element are oriented with respect to said shear force which yields opposite polarity.

8. The piezoelectric transducer of claim 7, wherein said force to be measured acts as a shear force on said main piezoelectric ceramic element; and said compensation force acts as a shear force on said compensation piezoelectric ceramic element.

9. The piezoelectric transducer of claim 8, wherein said piezoelectric transducer comprises at least one signal means for collecting negative main electric charge from a first face of said main piezoelectric ceramic element and negative compensation electric charge from a second face of said compensation piezoelectric ceramic element.

10. The piezoelectric transducer of claim 8, wherein said piezoelectric transducer comprises at least one ground means for collecting positive electric main charge from a second face of said main piezoelectric ceramic element and positive electric compensation charge from a first face of said compensation piezoelectric ceramic element.

11. The piezoelectric transducer of claim 1, wherein said effective main seismic mass means is composed by at least one of a seismic mass element, said compensation piezoelectric ceramic element, a compensation seismic mass element, an electric insulation element and a portion of said pre-load element arranged on a side of said main piezoelectric ceramic element that faces away from said base element.

12. The piezoelectric transducer of claim 1, wherein said compensation seismic mass means is composed by at least one of a compensation seismic mass element, an electric insulation element and a portion of said pre-load element arranged on a side of said main piezoelectric ceramic element that faces away from said base element.

13. The piezoelectric transducer of claim 1, wherein said piezoelectric transducer has a cantilever design, where pre-loaded parts are joined against one face of said base element; said cantilever design is unbalanced in that all the weight of said pre-loaded parts hangs due to gravity on a side of the one face of said base element.

14. The piezoelectric transducer of claim 1, wherein said piezoelectric transducer has a double cantilever design, where pre-loaded parts are joined against two faces of said base element; said double cantilever design is balanced in that the weight of said pre-loaded parts hangs due to gravity equally distributed on the two faces of said base element.

15. The piezoelectric transducer of claim 1, wherein said piezoelectric transducer has a double cantilever design, where pre-loaded parts are joined against two faces of said base element; said double cantilever design is unbalanced in that the weight of said pre-loaded parts hangs due to gravity unequally distributed on the two faces of said base element.

16. The piezoelectric transducer of claim 1, wherein said piezoelectric transducer has a triangular design, where pre-loaded parts are joined against three faces of said base element; said triangular design is balanced in that the weight of said pre-loaded parts hangs due to gravity equally distributed on the three faces of said base element.

17. The piezoelectric transducer of claim 1, wherein said piezoelectric transducer comprises up to three main piezoelectric ceramic elements and/or wherein said piezoelectric transducer comprises up to three compensation piezoelectric ceramic elements.

* * * * *